United States Patent
Jung et al.

[11] Patent Number: 5,572,367
[45] Date of Patent: Nov. 5, 1996

[54] ASPHERIC LENS FOR SIMULTANEOUSLY COLLIMATING AND SHAPING A LASER DIODE BEAM

[75] Inventors: Jin Ho Jung, Kyeongki-do; Young Jin Choi, Dagu, both of Rep. of Korea

[73] Assignee: Hyundai Electronics Ind. Co., Ltd., Kyeongki-do, Rep. of Korea

[21] Appl. No.: 219,978

[22] Filed: Mar. 30, 1994

[30] Foreign Application Priority Data

Mar. 30, 1993 [KR] Rep. of Korea .................. 1993-5080

[51] Int. Cl.⁶ .................. G02B 13/18; G02B 3/00
[52] U.S. Cl. .................. 359/708; 359/641; 359/651
[58] Field of Search .................. 359/708, 718, 359/648, 651, 641

[56] References Cited

U.S. PATENT DOCUMENTS

| | | | |
|---|---|---|---|
| 4,842,388 | 6/1989 | Tanaka | 359/718 |
| 4,863,248 | 9/1989 | Saka | 359/718 |
| 4,979,807 | 12/1990 | Matsuoka | 359/708 |
| 5,002,374 | 3/1991 | Ishibai | 359/708 |
| 5,020,888 | 6/1991 | Ishibai | 359/708 |
| 5,373,395 | 12/1994 | Adachi | 359/669 |

*Primary Examiner*—David C. Nelms
*Assistant Examiner*—Son Mai
*Attorney, Agent, or Firm*—Wenderoth, Lind & Ponack

[57] ABSTRACT

An outwardly divergent and elliptic input laser beam is converted into a collimated and circular laser beam using a single aspheric lens. An input surface of the aspheric lens has a convex hyperbolic spherical cross-sectional surface in a vertical direction normal to an optical axis and a concave spherical cross-sectional surface in a horizontal direction normal to the optical axis. An output surface of the aspheric lens has a planar cross-sectional surface in the vertical direction normal to the optical axis and a convex elliptical cross-sectional surface in the horizontal direction normal to the optical axis.

4 Claims, 4 Drawing Sheets

ASPHERIC LENS FOR SIMULTANEOUSLY COLLIMATING AND SHAPING A LASER DIODE BEAM

FIELD OF THE INVENTION

This invention relates to an aspheric lens adapted to simultaneously collimate and shape a laser diode beam in an optical system for optical recording media, and particularly to an aspheric lens element for use in a pickup optical system of optical disk drives (herein called ODDs) in which a laser diode beam records and reproduces information to and from an optical disk. The aspheric lens element serves to simultaneously collimate the laser diode beam into a parallel beam and shape an elliptic distribution of light intensity thereof to a circular distribution.

BACKGROUND OF THE INVENTION

A semiconductor laser is utilized in an optical disk apparatus for high-density information recording. A pickup optical system using the semiconductor laser as shown in FIG. 1 may comprise a laser diode 10, a collimator lens 20 for collimating a light beam emitted from the laser diode 10 into a parallel beam, a shaping means 20' and 20" for shaping a beam collimated by the collimator lens 20 into a cross-sectionally circular beam, a beam splitter 30 for splitting the shaped beam, a reflector 40 for deflecting the direction of the split part of the beam, an object lens 50 for forming an image on a disk using the deflected beam, a focusing lens 70 for controlling a focal length of a part of the beam deflected by the splitter, a translucent polarization beam splitter 80 for half-mirroring the beam passing through the focusing lens 70, and photo detectors 90 and 100 for detecting and converting a light half-mirrored by the translucent polarization beam splitter.

A divergent beam emitted from the laser diode 10 has different divergent angles in the directions normal and parallel to the diode junction so that it takes on an elliptic cross section. To reshape the elliptic cross section to a circular one, in this system, a shaping means 20' and 20" must be provided, which is constituted by a cylindrical lens or a triangular prism.

If a cylindrical lens shaper is adopted, as shown in FIG. 3, a collimator lens 20 is used to collimate a beam from the laser diode into a parallel beam and a pair of cylindrical lenses 20A and 20B are used to shape the collimated beam. The beam collimated by the collimator lens has a parallel and normal diameters D1 and D2, the latter being greater than the former, and thus has an elliptic cross-section. The cylindrical lenses 20A and 20B has a power exclusively in the parallel direction and causes the parallel diameter D1 to take on an equivalent dimension as the normal diameter D2, thus forming a cross-sectional circular beam.

If a triangular prism shaper is used, a pair of prisms 25, 25 enlarge the beam in the parallel direction as shown in FIG. 4 by action of combined refractive indices as described below.

According to Snell's law, $\frac{\sin\theta_1}{\sin\theta_2} = \frac{n}{n'} = n$ where $\theta_1$ is the incident angle, the refractive index of the incident medium is n, and the refractive index of atmospheric air is n'=1.

Thus, $\sin\theta_1 = n\sin\theta_2$.

A beam shaping ration $\frac{D2}{D1} = \frac{\cos\theta_2}{\cos\theta_1}$ $\frac{D3}{D1} = \frac{D2}{D1} \times \frac{D3}{D2} = \frac{\cos\theta_2}{\cos\theta_1} \times \frac{\cos\theta_4}{\cos\theta_3}$ Each of the above described beam shaping techniques increase both a length of the total optical path and a size of the optical head. Also, the cylindrical lenses are difficult to align. Further, the triangular prisms are expensive and voluminous, contributing to an increase in the volume and weight of the disk drive. Finally, time is needed to record and reproduce the information therein.

SUMMARY OF THE INVENTION

An integral aspheric lens element is configured such that a cross-sectionally elliptic beam enters a first face thereof and exits a second face thereof so as to effect simultaneous collimation and shaping of the beam. Specifically, the first and second faces of the aspheric lens are formed in curvatures determined by analysis so as to cause parallel components to be imparted with an equivalent size to that of normal components in the divergence angle for shaping a cross-sectionally elliptic beam into a cylindrical beam. The single lens element effects the function which the triangular prism or cylindrical lenses and collimator lens conventionally achieved, thus decreasing cost of manufacture and enabling miniaturization and reduced weight. Use of a high divergence optical element allows the chromatic aberration to be approximated to the diffraction performance limit and advantageously substantially eliminates a spheric aberration by selecting a combination of conic, spheric and planar factors adjusted to each other.

It is readily apparent that an aspheric lens element of the invention may be advantageously used in any apparatus for recording and reproduction by means of a laser diode, such as players of compact disks, mini-disks, compact disk-interactive, laser disks, or the like.

The invention achieves the aim of simultaneous collimation and shaping of a laser beam using an integral aspheric lens, rather than prisms or cylindrical lenses.

To achieve the above aim of simultaneous collimation and shaping of a laser beam, an integral aspheric lens is provided according to the invention which has a first and second faces conjugated with curvatures calculated for the normally and parallel divergent components of the laser beam whereby the normal and parallel beam components are separated according to a difference in divergence angle of the cross-sectionally elliptic beam and the parallel components diverge at a distribution rate equivalent to a desired normal-to-parallel divergence ratio.

DETAILED DESCRIPTION OF THE PREFERRED EMBODIMENTS

Figure 1:
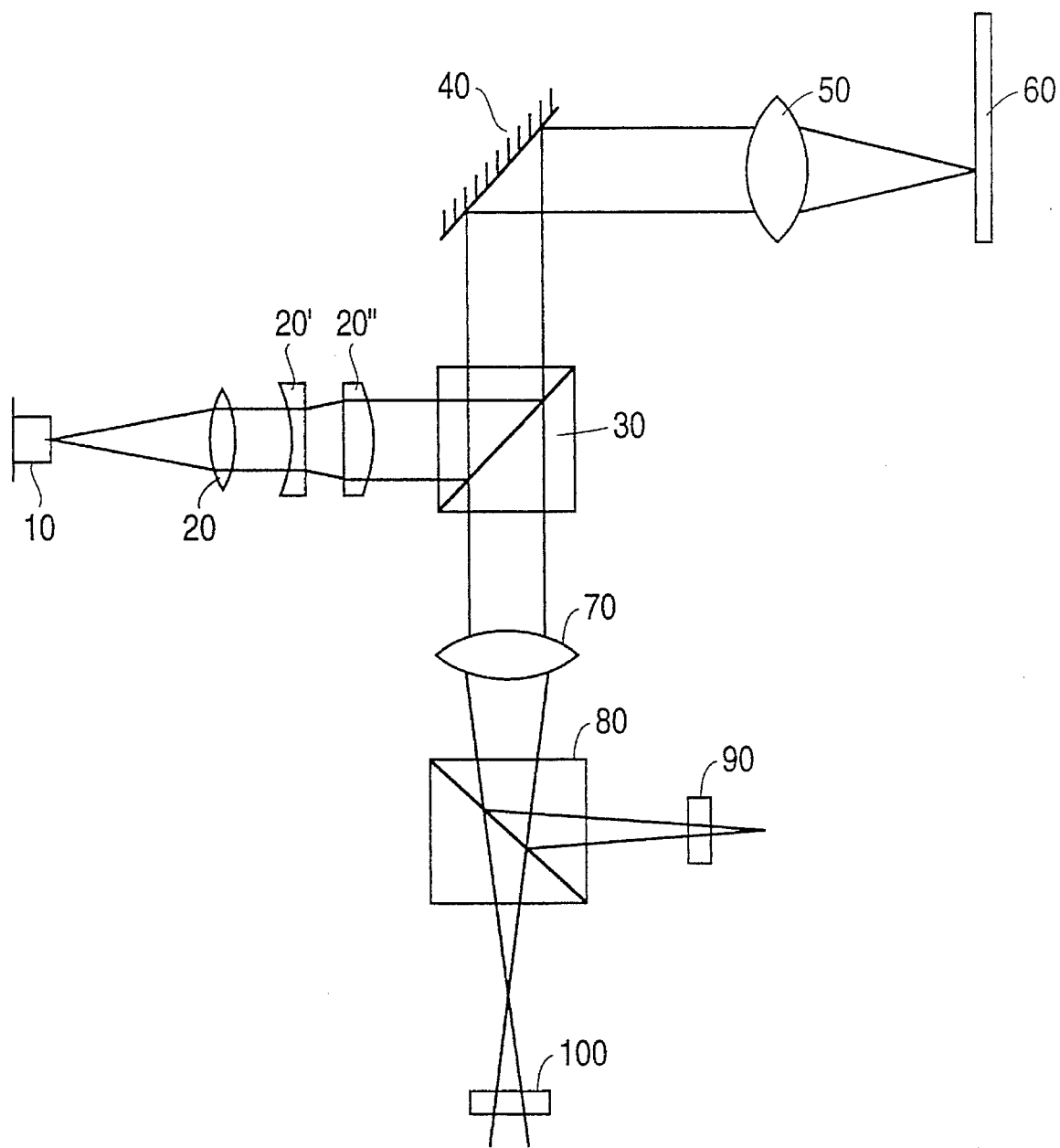
FIG. 1 shows a schematic diagram of an optical system of an optical disk drive.
Figure 2:
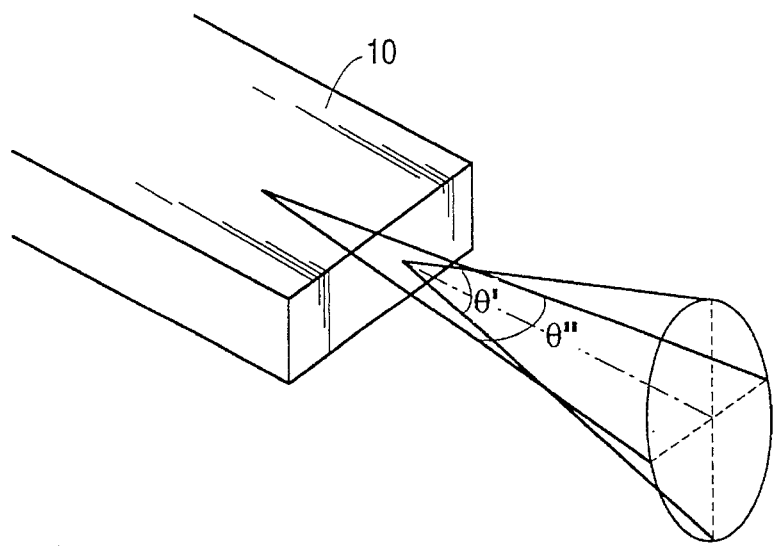
FIG. 2 is similar to FIG. 1, but showing a divergent beam from a laser diode.
Figure 4:
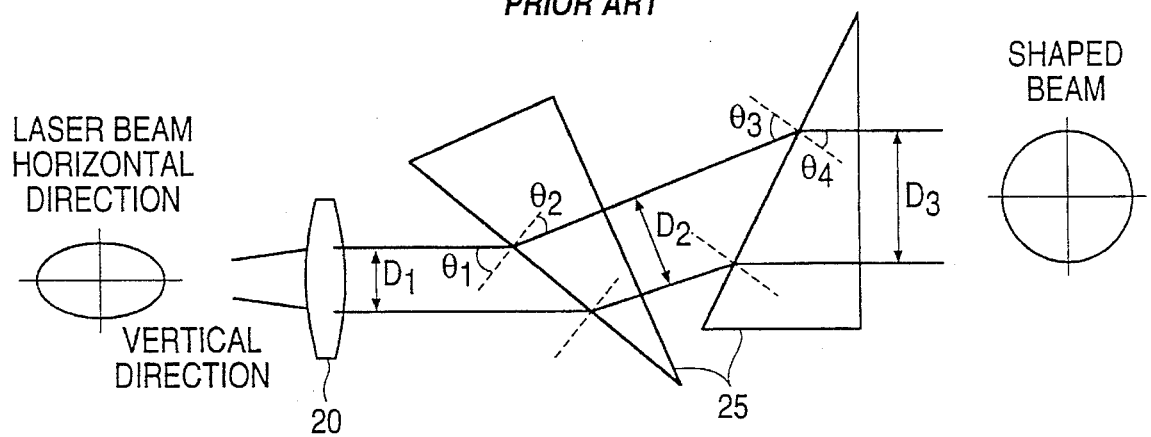
FIG. 4 is similar to FIG. 3 but with prisms.
Figure 3:
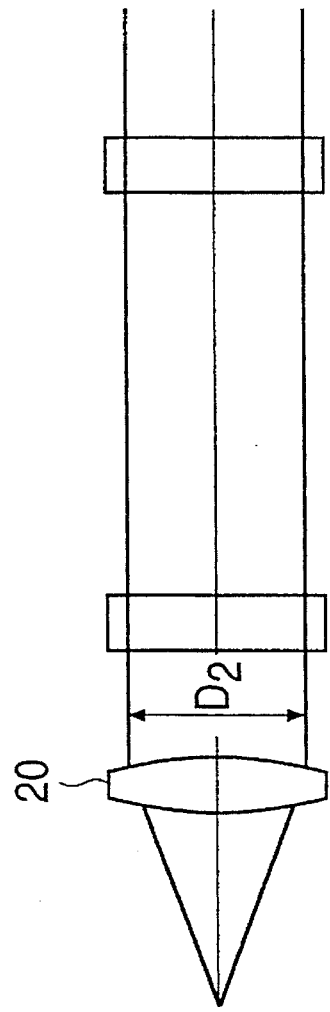
FIG. 3 schematically shows a conventional beam shaper with cylindrical lenses.
Figure 3:
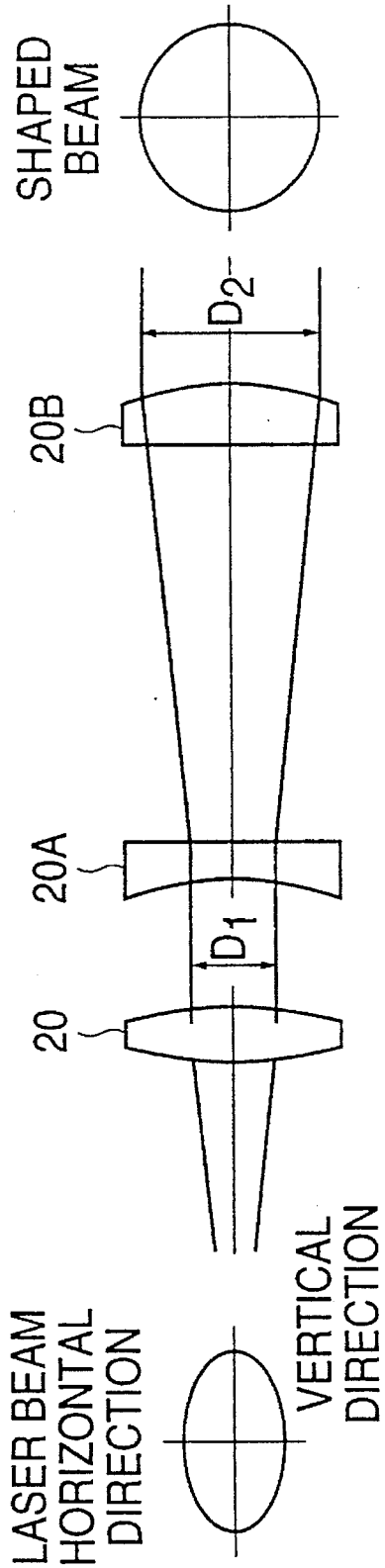
Figure 5:
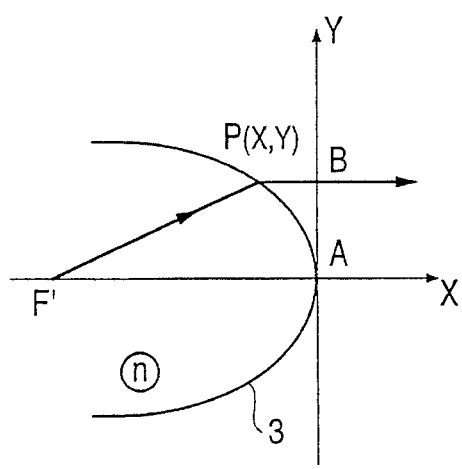
FIG. 5 shows a mode of one aspect of the invention for eliminating a spheric aberration in the parallel direction.
Figure 6:
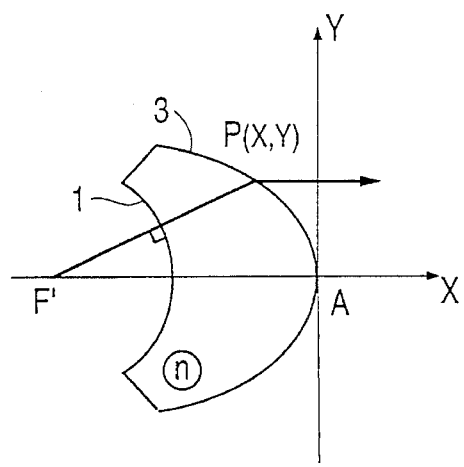
FIG. 6 shows a modification to FIG. 5.
Figure 7:
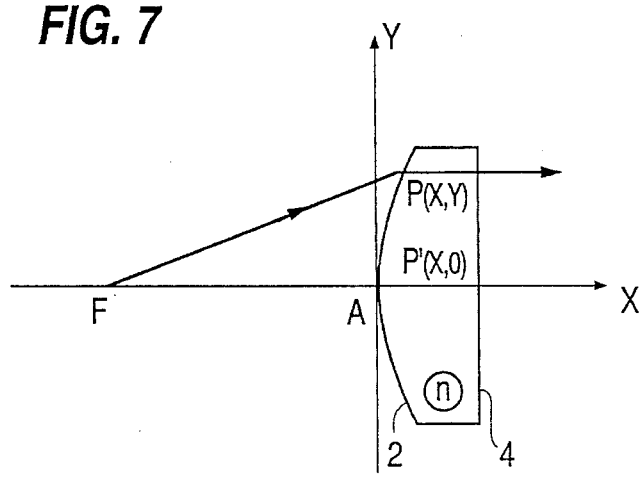
FIG. 7 is a mode of other aspect of the invention for eliminating a spheric aberration in the normal direction.
Figure 8:
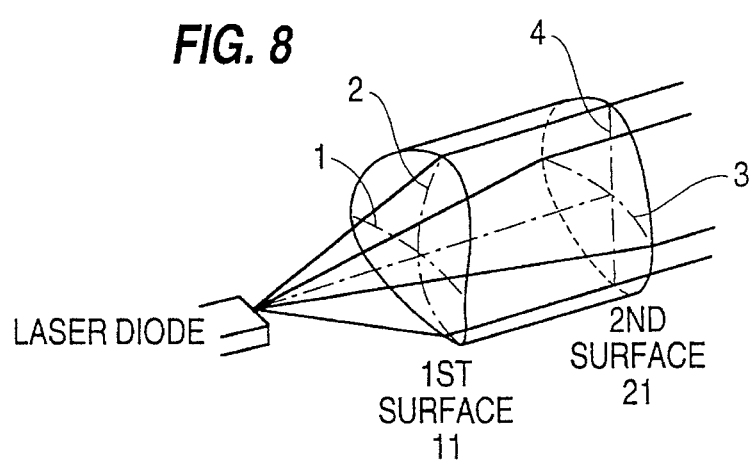
FIG. 8 shows an aspheric lens according to the invention. In the drawings, numeral 1 designates concave spheric curvature; 2 a convex hyperbolic curvature; 3 a convex elliptic curvature; 4 a plane; 11 a first face; 20 a collimator lens; 20A a cylindrical lens; 20B a cylindrical lens; 21 a second face; and 25 a triangular prism.

A semiconductor laser diode emits a cross-sectionally elliptic beam having a different divergence angle in the vertical direction from that in the horizontal direction to the junction as shown in FIG. 2. The laser diode beam is taken to have vertical and horizontal divergent components which are numerically analyzed to determine the parameters completely removing a spheric aberration for the respective components in relation to a field of zero degree. Consequently, a concave spheric curvature 1 and a convex elliptic curvature 3 are obtained as shown in FIGS. 5 and 6 for the parallel divergent component. For the vertically divergent component, a convex hyperbolic curvature 2 and a plane 4 are obtained as shown in FIG. 7. As shown in FIG. 8, an aspheric lens element according to the invention has a first face 11 formed with the concave spheric and convex hyperbolic curvatures 1 and 2 in conjugation and a second face 21 with the convex elliptic curvature 3 and the plane 4 in conjugation. These aspheric faces can eliminate or minimize the spheric aberration which is different for a spheric face.

The numerical analysis will be described with reference to FIGS. 5 to 7.

$$X(\text{spheric}) = \frac{CY^2}{1 + (1 - C^2Y^2)^{1/2}}$$

$$X(\text{aspheric}) = \frac{CY^2}{1 + [1 - (1 + K)(C^2Y^2)]^{1/2}} + A_1Y^4 + A_2Y^6 + A_3Y^8 + A_4Y^{10}$$

X(spheric): spheric curvature
X(aspheric): aspheric curvature
C: curvature
K: conic constant
A1, A2, etc.: aspheric constant K or conic constant is zero for a spheric curvature. It ranges from −1 to 0 for ellipsis, and is −1 for parabola and less than −1 for hyperbola.

The conic constant will be calculated by numerical analysis for eliminating a spheric aberration for the vertical and horizontal divergent components. For the horizontal component, the refractive face separates atmospheric air on the right side with a refractive index being 1 and glass on the left side with an index "n" as shown in FIGS. 5 and 6 which shows a rectangular coordinate with an origin lying at the apex A of the refractive face. A point B lies at any position on the axis. A point P is located on the refractive face with a coordinate (x,y). If the focal point F' lies on axis x, then the refractive face is symmetric about axis x. Light ray passing through the focal point F' is refracted at a point (x,y) and progresses in parallel to axis x. The ray intersect axis y at a point B and will have the same path length between the focal point F' and the apex A if no spheric aberration takes place relative to an indefinite image. The optical path length could be assumed to be constant according to Fermat's principle. Thus, BP+n(PF')=n(AF').

The coordinate, (x,y) of the point P and a line segment AF' has a length f. Thus, x+n[y+(f−x)]=nf.

The equation leads to an elliptic function:

$$\frac{[x - nf/(n+1)]^2}{n^2f^2/(n+1)^2} + \frac{y^2}{f^2(n-1)/(n+1)} = 1$$

The long and short axes a and b can be obtained as follows:

$a = nf/(n+1)$ $b = f[(n-1)/(n+1)]^{1/2}$.

The eccentricity e is defined by c/a. From $c=(a^2-b^2)^{1/2}$, the eccentricity is $n^{-1}$.

The conic constant K can be thus defined by $K=-e^2$ or $K=-n^{-2}$.

The convex elliptic curvature calculated for eliminating a spheric aberration is shown at 3 of FIG. 5. The focal point is located in the glass in this embodiment. The convex spheric face 1 may be located normal to the path F'P to thereby place the focal point in the air as shown in FIG. 6 with the length of the optical path unchanged, and with no spheric aberration occurring.

For the vertical divergent component, a length of the path formed by a ray passing through a focal point F to a point P is the same as the one formed by a ray through the apex A and a point P' (x,0). The curvature of the refractive face satisfying this requirement can be obtained by the following procedure. The below equation is met by equidistance from the focal point.

$f+nx=[y^2+(f+x)^2]^{1/2}$

This leads to the hyperbolic definition:

$$\frac{[x + f/(n+1)]^2}{f^2/(n+1)^2} + \frac{y^2}{f^2(n^2-1)/(n+1)^2} = 1$$

The long and short axes a and b can be obtained as follows:

$$a = \frac{f}{(n+1)}$$

$$b = \frac{f(n^2-1)^{1/2}}{(n+1)}$$

The eccentricity e is defined by c/a. From $c=(a^2+b^2)^{1/2}$, the eccentricity is n.

The conic constant K can be defined by $K=-e^2$, that is, $K=-n^{-2}$.

The above numerical analysis can thus be used to determine the configuration of the first and second faces of the aspheric lens.

When a laser diode beam has a normal-parallel divergence ratio at 2.3 to 1, and a wavelength at 785 nms, the above definitions produces values for the normal and parallel divergent components. The effective focal length EFL is 1.00. The front focal length FFL is 1.00. The conic constant K1 is −2.1111. The effective focal length EFL is 2.30. The front focal length FFL is 1.00. The conic constant K2 is −0.47367.

Thus, the configurations of the first and second faces of the aspheric lens according to the invention are determined by the aspheric functions.

What is claimed is:

1. An aspheric lens for converting an input laser beam into a collimated laser beam having a circular cross-section normal to an optical path, the input laser beam being outwardly divergent and defining vertical and horizontal components normal to the optical path and having a non-circular cross-section normal to the optical path, a vertical angle of divergence of the input laser beam relative to the vertical components being greater than a horizontal angle of divergence of the input laser beam relative to the horizontal components, said aspheric lens comprising a lens body having opposite first and second surfaces which respectively receive the input laser beam and output the collimated laser beam, the collimated laser beam having the circular cross-section normal to an optical axis of said lens body, said first surface having a configuration in which the vertical components of the input laser beam are refracted in a direction parallel to the optical axis upon entering the lens body and the horizontal components of the input laser beam are not refracted upon entering the lens body, and said second surface having a configuration in which the refracted vertical components of the input laser beam are not refracted upon exiting the lens body and the non-refracted horizontal components of the input laser beam are refracted in a direction parallel to the optical axis upon exiting the lens body.

2. The lens according to claim 1, wherein the first surface has a convex hyperbolic spherical cross-sectional surface in a vertical direction normal to the optical axis and a concave spherical cross-sectional surface in a horizontal direction normal to the optical axis.

3. The lens according to claim 1, wherein the second surface has a planar cross-sectional surface in a vertical direction normal to the optical axis and a convex elliptical cross-sectional surface in a horizontal direction normal to the optical axis.

4. The lens according to claim 2, wherein the second surface has a planar cross-sectional surface in a vertical direction normal to the optical axis and a convex elliptical cross-sectional surface in a horizontal direction normal to the optical axis.

* * * * *